US012701952B2

(12) United States Patent
Lee et al.

(10) Patent No.: US 12,701,952 B2
(45) Date of Patent: Aug. 4, 2026

(54) HEATING UNIT, SUBSTRATE TREATING APPARATUS INCLUDING THE SAME, METHOD OF CONTROLLING HEATING UNIT

(71) Applicant: SEMES CO., LTD., Cheonan-si (KR)

(72) Inventors: Tae Sub Lee, Seoul (KR); Gyu Hyun Kim, Cheonan-si (KR); Sung Yong Lee, Yongin-si (KR); Dong Hyuk Seo, Pyeongtaek-si (KR)

(73) Assignee: Semes Co., Ltd., Cheonan-si (KR)

( * ) Notice: Subject to any disclaimer, the term of this patent is extended or adjusted under 35 U.S.C. 154(b) by 979 days.

(21) Appl. No.: 17/902,056

(22) Filed: Sep. 2, 2022

(65) Prior Publication Data

US 2023/0072272 A1 Mar. 9, 2023

(30) Foreign Application Priority Data

Sep. 3, 2021 (KR) ......................... 10-2021-0117709

(51) Int. Cl.
*H10P 72/00* (2026.01)
(52) U.S. Cl.
CPC ...... *H10P 72/0434* (2026.01); *H10P 72/0404* (2026.01); *H10P 72/0602* (2026.01)
(58) Field of Classification Search
CPC ......... H01L 21/67023; H01L 21/67103; H01L 21/67109; H01L 21/6715; H01L 21/67173; H01L 21/67178; H01L 21/6719; H01L 21/67248; H10P 72/0404; H10P 72/0432; H10P 72/0434; H10P 72/0448; H10P 72/0456; H10P 72/0458; H10P 72/0462; H10P 72/0602

USPC ... 219/206, 443.1–468.2, 476–477, 507–511
See application file for complete search history.

(56) References Cited

U.S. PATENT DOCUMENTS

| | | | | |
|---|---|---|---|---|
| 4,772,779 A | * | 9/1988 | Scheidler | H05B 3/748 219/448.11 |
| 5,171,973 A | * | 12/1992 | Higgins | H05B 3/742 219/457.1 |
| 5,796,076 A | * | 8/1998 | Azuma | H05B 1/0283 219/486 |

(Continued)

FOREIGN PATENT DOCUMENTS

| | | |
|---|---|---|
| JP | H5-346749 A | 12/1993 |
| JP | 2000-194237 A | 7/2000 |

(Continued)

OTHER PUBLICATIONS

Japanese Office Action, dated Aug. 1, 2023, issued in corresponding Japanese Patent Application No. 2022-136692.

*Primary Examiner* — Sang Y Paik
(74) *Attorney, Agent, or Firm* — Harness, Dickey & Pierce, P.L.C.

(57) ABSTRACT

Provided is a heating unit including: a heating plate for heating a substrate; a heater installed in the heating plate; and a control unit for controlling the heater, in which wherein the heater includes: a first heater; and a second heater installed at a position different from a position of the first heater, and the control unit includes: a power source for transferring power to at least one of the first heater and the second heater; and a switching module for connecting the first heater and the second heater in series or connecting the first heater and the second heater in parallel.

6 Claims, 10 Drawing Sheets

(56)        References Cited

U.S. PATENT DOCUMENTS

2006/0096972 A1 * 5/2006 Nakamura ........ H01L 21/67103
                                                    219/544
2012/0006807 A1 * 1/2012 Berberich ............. G01N 1/312
                                                    219/486
2019/0341274 A1 * 11/2019 Lee ................... H01L 21/67023

FOREIGN PATENT DOCUMENTS

| | | | |
|---|---|---|---|
| JP | 2001-167653 | A | 6/2001 |
| JP | 2003-271005 | A | 9/2003 |
| JP | 2009-125494 | A | 6/2009 |
| JP | 2012-089653 | A | 5/2012 |
| JP | 2018-78328 | A | 5/2018 |
| KR | 10-2020-0034871 | A | 4/2020 |

* cited by examiner

HEATING UNIT, SUBSTRATE TREATING APPARATUS INCLUDING THE SAME, METHOD OF CONTROLLING HEATING UNIT

CROSS-REFERENCE TO RELATED APPLICATIONS

This application claims priority to and the benefit of Korean Patent Application No. 10-2021-0117709 filed in the Korean Intellectual Property Office on Sep. 3, 2021, the entire contents of which are incorporated herein by reference.

TECHNICAL FIELD

The present invention relates to a heating unit, a substrate treating apparatus including the same, and a method of controlling the heating unit.

BACKGROUND ART

In order to manufacture a semiconductor device or a flat display panel, various processes, such as a photolithography process, an etching process, an ashing process, a thin film deposition process, a cleaning process, are performed. Among these processes, the photolithography process includes a coating process of forming a coating film by supplying a coating liquid, such as a photoresist, onto a substrate, such as a wafer, an exposure process of irradiating light to the coating film formed on the substrate by using a mask, and a developing process of obtaining a desired pattern on the substrate by supplying a developer to the coating film on which the exposure process has been performed.

In addition, in general, in order to stabilize the coating film and the pattern formed on the substrate, a heat treatment process is performed between the coating process and the exposure process, between the exposure process and the developing process, and after the developing process. In the heat treatment process, a substrate is placed on a heating plate disposed in a heat treating chamber, and the heating plate heats the substrate.

FIG. 1 is a diagram illustrating a control circuit for controlling a heater provided in a general heating plate. Referring to FIG. 1, a control circuit 1 includes a control unit 2 and a heater unit 6. The control unit 2 includes a power source 3, a first switch 4, and a second switch 5. The heater unit 6 is installed on the heating plate and includes a first heater 7 and a second heater 8 which are resistance heating elements. The first heater 7 and the second heater 8 are connected in parallel with respect to the power source 3. In addition, heat is independently generated by the on/off of the first switch 4 and the second switch 5.

A resistance value of the first heater 7 and the second heater 8 varies according to a change in temperature. For example, as illustrated in FIG. 2, the resistivity of the resistance heating element (for example, a heating wire) increases as the temperature increases. This lowers the facility load factor.

Specifically, the facility load factor is as follows.

$$\text{Facility load rate} = \frac{\text{Actual used current in facility run status}}{\text{Peak current after facility turn on}} \, [\%]$$

Resistance, current, and voltage have a relationship of V=IR. Here, the voltage is constant. The resistance of the heaters 7 and 8 increases as the temperature of the heaters 7 and 8 rises. As the facility driving continues and the temperature of the heaters 7 and 8 increases, the current flowing in the heaters 7 and 8 decreases. In other words, the current flowing in the heaters 7 and 8 varies according to the temperature change of the heaters 7 and 8. In general, the facility system is designed based on the overcurrent (peak current) that occurs immediately after the heaters 7 and 8 are turned on. The design of these facility systems is inefficient in terms of energy consumption efficiency.

SUMMARY OF THE INVENTION

The present invention has been made in an effort to provide a heating unit capable of improving a facility load factor, a substrate treating apparatus including the same, and a method of controlling the heating unit.

The present invention has also been made in an effort to provide a heating unit capable of improving a capacity of a facility system, a substrate treating apparatus including the same, and a method of controlling the heating unit.

The present invention has also been made in an effort to provide a heating unit capable of improving energy consumption efficiency, a substrate treating apparatus including the same, and a method of controlling the heating unit.

The problem to be solved by the present invention is not limited to the above-mentioned problems, and the problems not mentioned will be clearly understood by those skilled in the art from the present specification and the accompanying drawings.

An exemplary embodiment of the present invention provides a heating unit including: a heating plate for heating a substrate; a heater installed in the heating plate; and a control unit for controlling the heater, in which wherein the heater includes: a first heater; and a second heater installed at a position different from a position of the first heater, and the control unit includes: a power source for transferring power to at least one of the first heater and the second heater; and a switching module for connecting the first heater and the second heater in series or connecting the first heater and the second heater in parallel.

According to the exemplary embodiment, the heating unit may include a power line for transferring the power of the power source to the first heater and/or the second heater, in which the power line includes: a first supply line connected to a front end of the first heater; a first return line connected to a rear end of the first heater; a second supply line connected to a front end of the second heater; and a second return line connected to a rear end of the second heater.

According to the exemplary embodiment, the switching module may include: a switching line; a first switching switch switched between the switching line and the first return line; and a second switching switch switched between the switching line and the second supply line.

According to the exemplary embodiment, when the first switching switch and the second switching switch are switched to the switching line, the first heater and the second heater may be connected in series, and when the first switching switch is switched to the first return line and the second switching switch is switched to the second supply line, the first heater and the second heater may be connected in parallel.

According to the exemplary embodiment, the control unit may include: a first power switch installed on the first supply line; and a second power switch installed on the second supply line.

According to the exemplary embodiment, the control unit may control the first switching switch and the second switching switch so as to control a temperature of the heater in a first mode in which the first heater and the second heater are connected in series, and then control the temperature of the heater in a second mode in which the first heater and the second heater are connected in parallel.

According to the exemplary embodiment, the heating unit may further include: a first sensor for sensing a temperature of the first heater or a first region of the heating plate heated by the first heater; and a second sensor for sensing a temperature of the second heater or a second region of the heating plate heated by the second heater.

According to the exemplary embodiment, when any one of a first temperature measured by the first sensor and a second temperature measured by the second sensor is equal to or higher than a preset switching temperature, the control unit may control the first switching switch and the second switching switch so that the first mode is switched to the second mode.

According to the exemplary embodiment, when both the first temperature and the second temperature are lower than a preset switching temperature, the control unit may derive a difference value between the first temperature and the second temperature, and the control unit may control the first switching switch and the second switching switch so that the first mode is switched to the second mode when the derived difference value is equal to or greater than a preset interlock temperature, and the first mode is maintained when the derived difference value is smaller than the interlock temperature.

According to the exemplary embodiment, the control unit may derive a difference value between the first temperature and the second temperature again after the first mode is switched to the second mode, and the control unit may control the first switching switch and the second switching switch so that the second mode is maintained when the re-derived difference value is equal to or greater than a preset restart temperature, and the second mode is switched to the first mode when the re-derived difference value is smaller than the restart temperature.

Another exemplary embodiment of the present invention provides a method of controlling a heating unit including a heating plate and a heater installed in the heating plate, the heater including a first heater and a second heater, the method including: heating a temperature of a heater in a mode selected between a first mode in which the first heater and the second heater are connected in series to control the temperature of the heater, and a second mode in which the first heater and the second heater are connected in parallel to control the temperature of the heater.

According to the exemplary embodiment, the temperature of the heater may be increased in the first mode, and when a preset condition is satisfied, the temperature of the heater may be controlled in the second mode by switching the first mode to the second mode.

According to the exemplary embodiment, a first temperature that is the temperature of the first heater or a temperature of a first region of the heating plate heated by the first heater and a second temperature that is the temperature of the second heater or a temperature of a second region of the heating plate heated by the second heater may be measured, and whether to switch the first mode to the second mode may be determined based on the measured first temperature and second temperature.

According to the exemplary embodiment, when the first temperature or the second temperature is equal to or higher than a preset switching temperature, the first mode may be switched to the second mode.

According to the exemplary embodiment, when the first temperature and the second temperature are lower than a preset switching temperature, a difference value between the first temperature and the second temperature may be derived, and the temperature of the heater may be controlled by switching the first mode to the second mode when the derived difference value is equal to or greater than a preset interlock temperature, and by maintaining the first mode when the derived difference value is smaller than the interlock temperature.

According to the exemplary embodiment, a difference value between the first temperature and the second temperature may be derived again after the first mode is switched to the second mode, and the temperature of the heater may be controlled by maintaining the second mode when the re-derived difference value is equal to or greater than a preset restart temperature, and by switching the second mode to the first mode when the re-derived difference value is smaller than the restart temperature.

Still another exemplary embodiment of the present invention provides a substrate treating apparatus, including: a heat treating chamber for performing a heating process on a substrate; and a liquid processing chamber for performing a liquid processing process of supplying a liquid to the substrate; and a transfer chamber for transferring a substrate between the liquid processing chamber and the heat treating chamber, in which the heat treating chamber includes: a heating plate for heating a substrate; a heater installed in the heating plate; and a control unit for controlling the heater, and the heater includes: a first heater that is a resistance heating element; and a second heater which is a resistance heating element installed at a position different from a position of the first heater, and the control unit includes: a power source for transferring power to at least one of the first heater and the second heater; and a switching module for connecting the first heater and the second heater in series, or connecting the first heater and the second heater in parallel.

According to the exemplary embodiment, the heat treating chamber may include a power line for transferring power of the power source to the first heater and/or the second heater, and the power line may include: a first supply line connected to a front end of the first heater; a first return line connected to a rear end of the first heater; a second supply line connected to a front end of the second heater; and a second return line connected to a rear end of the second heater, and the switching module may include: a switching line; a first switching switch switched between the switching line and the first return line; and a second switching switch switched between the switching line and the second return line, and when the first switching switch and the second switching switch are switched to the switching line, the first heater and the second heater may be connected in series, and when the first switching switch is switched to the first return line and the second switching switch is switched to the second supply line, the first heater and the second heater may be connected in parallel.

According to the exemplary embodiment, the control unit may control the first switching switch and the second switching switch so as to increase the temperature of the heater in a first mode in which the first heater and the second heater are connected in series, and then control the temperature of the heater in a second mode in which the first heater and the second heater are connected in parallel.

According to the exemplary embodiment, the substrate treating apparatus may further include: a first sensor for sensing a temperature of the first heater or a first region of the heating plate heated by the first heater; and a second sensor for sensing a temperature of the second heater or a second region of the heating plate heated by the first heater, in which the control unit may control the first switching switch and the second switching switch so as to control the temperature of the heater in a mode selected between the first mode and the second mode based on a first temperature that is a temperature measured by the first sensor and a second temperature that is a temperature measured by the second sensor.

According to the exemplary embodiment of the present invention, it is possible to improve a facility load rate.

Further, according to the exemplary embodiment of the present invention, it is possible to improve a capacity of a facility system.

Furthermore, according to the exemplary embodiment of the present invention, it is possible to improve energy consumption efficiency.

The effect of the present invention is not limited to the foregoing effects, and non-mentioned effects will be clearly understood by those skilled in the art from the present specification and the accompanying drawings.

BRIEF DESCRIPTION OF THE DRAWINGS

FIG. 5 is a top plan view of the substrate treating apparatus of FIG. 3.

DETAILED DESCRIPTION

Figure 1:
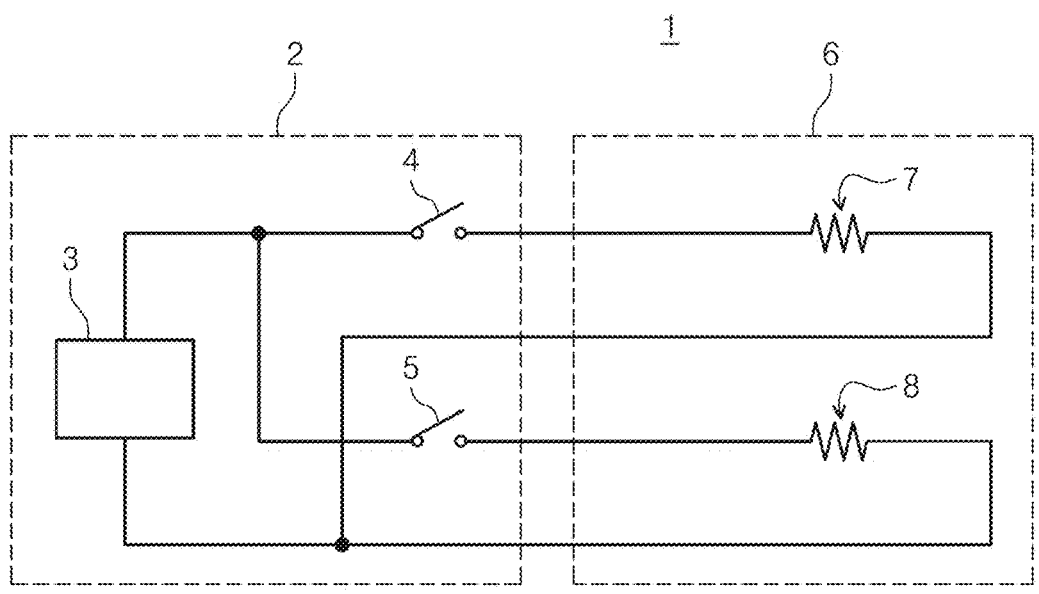
FIG. 1 is a diagram illustrating a control circuit for controlling a heater provided in a general heating plate.
Figure 2:
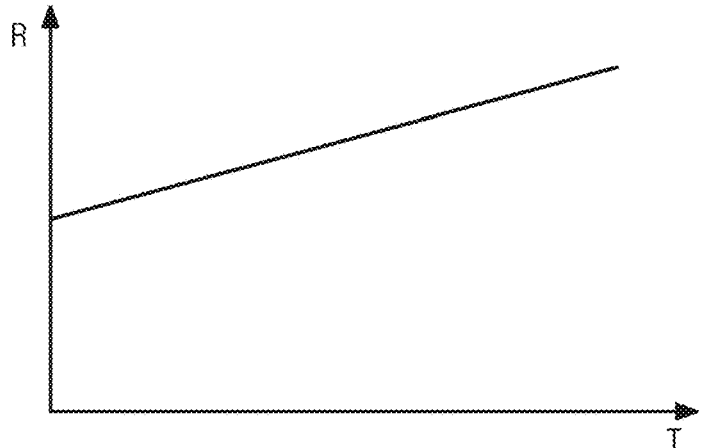
FIG. 2 is a graph schematically illustrating a change in resistance of a heater according to a change in temperature.

Hereinafter, an exemplary embodiment of the present invention will be described more fully hereinafter with reference to the accompanying drawings, in which exemplary embodiments of the invention are illustrated. However, the present invention can be variously implemented and is not limited to the following embodiments. In addition, in describing an exemplary embodiment of the present invention in detail, if it is determined that a detailed description of a related well-known function or configuration may unnecessarily obscure the gist of the present invention, the detailed description thereof will be omitted. In addition, the same reference numerals are used throughout the drawings for parts having similar functions and actions.

Unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between" and "just between" or "adjacent to ~" and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

Hereinafter, an exemplary embodiment of the present invention will be described with reference to FIGS. 3 to 13. In addition, all configurations for transferring a substrate W described below may be referred to as a transfer unit.

Figure 3:
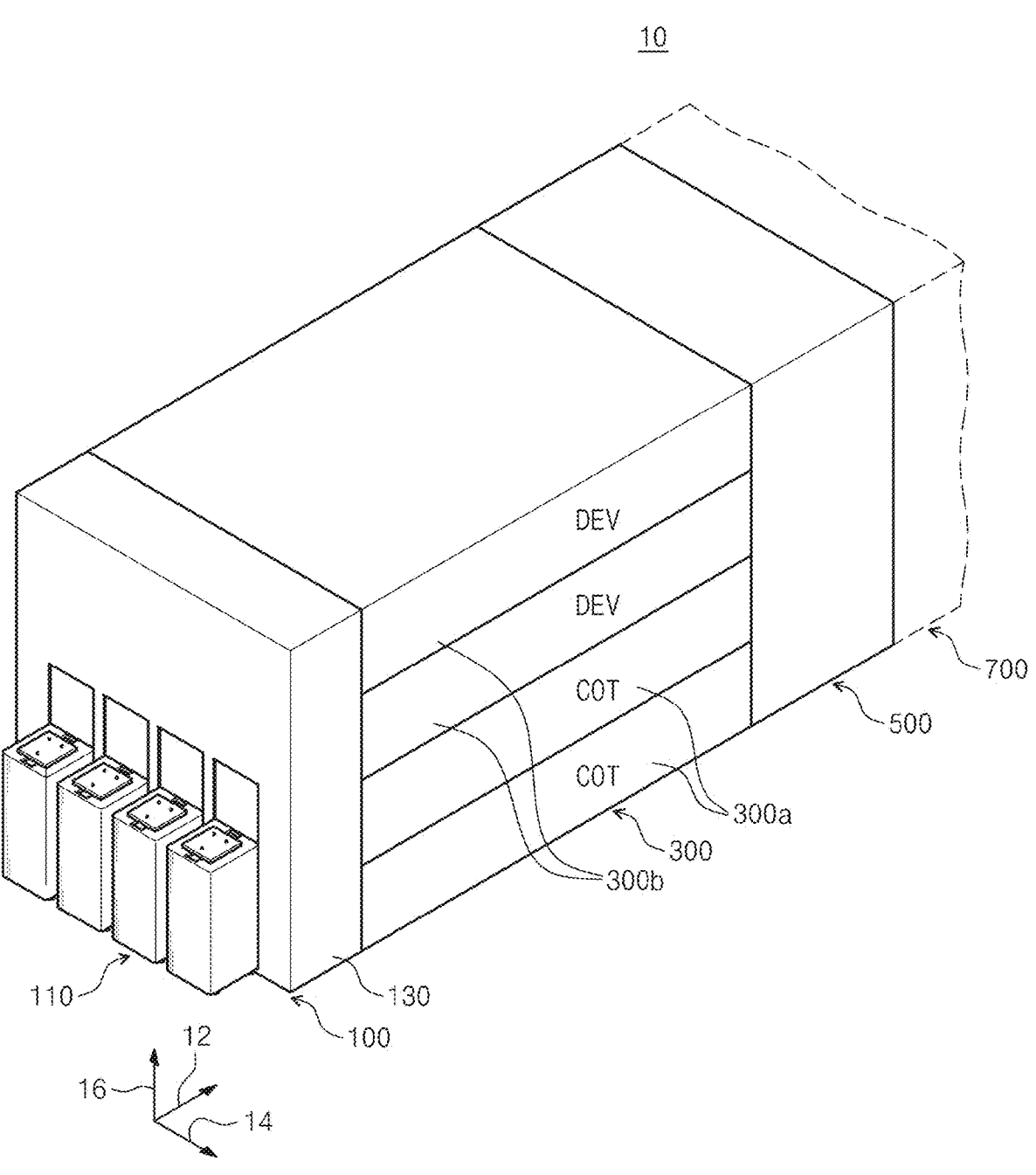
FIG. 3 is a perspective view schematically illustrating a substrate treating apparatus according to an exemplary embodiment of the present invention.
Figure 4:
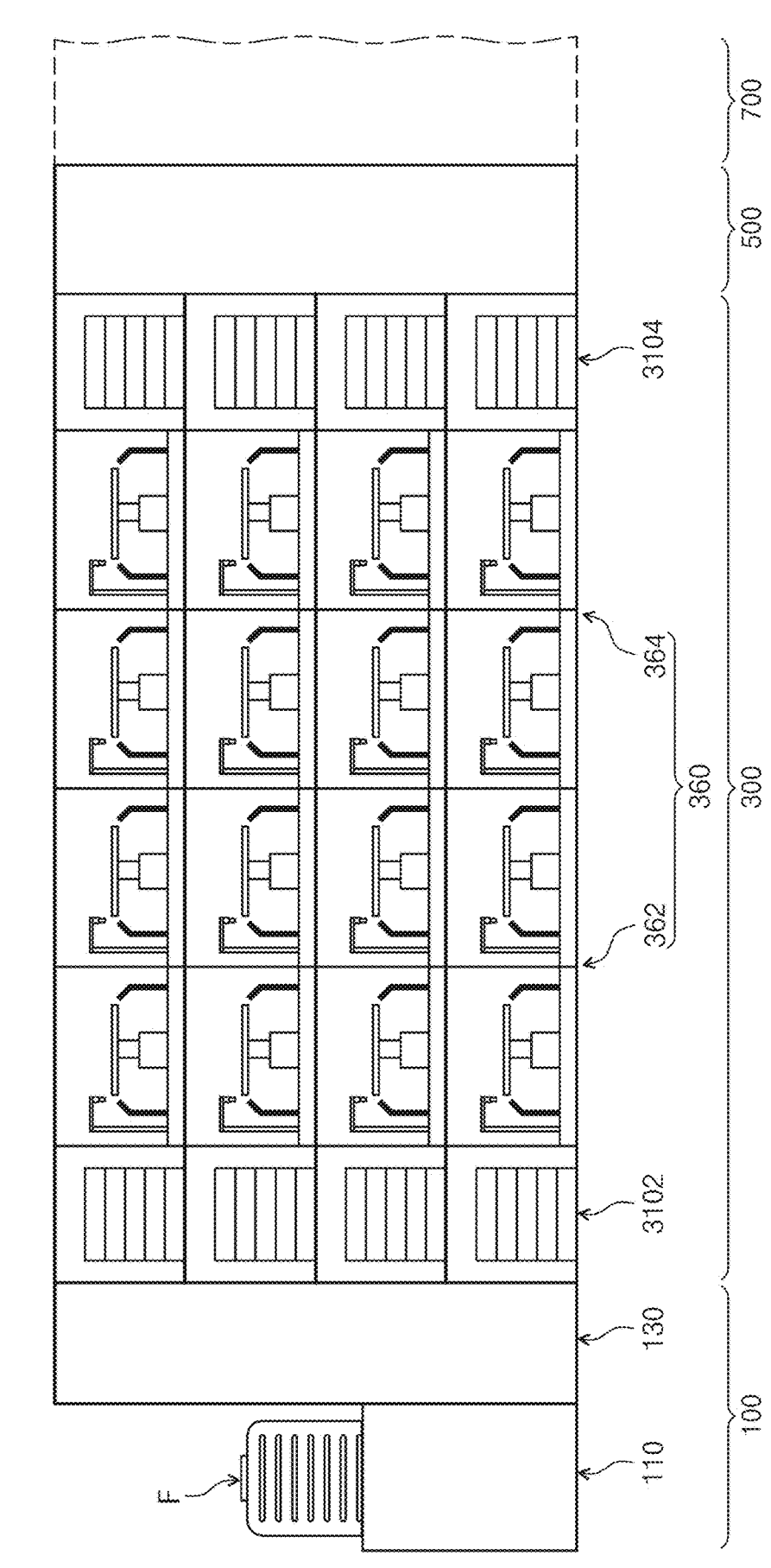
FIG. 4 is a cross-sectional view of a coating block or a developing block of the substrate treating apparatus of FIG. 3.
Figure 5:
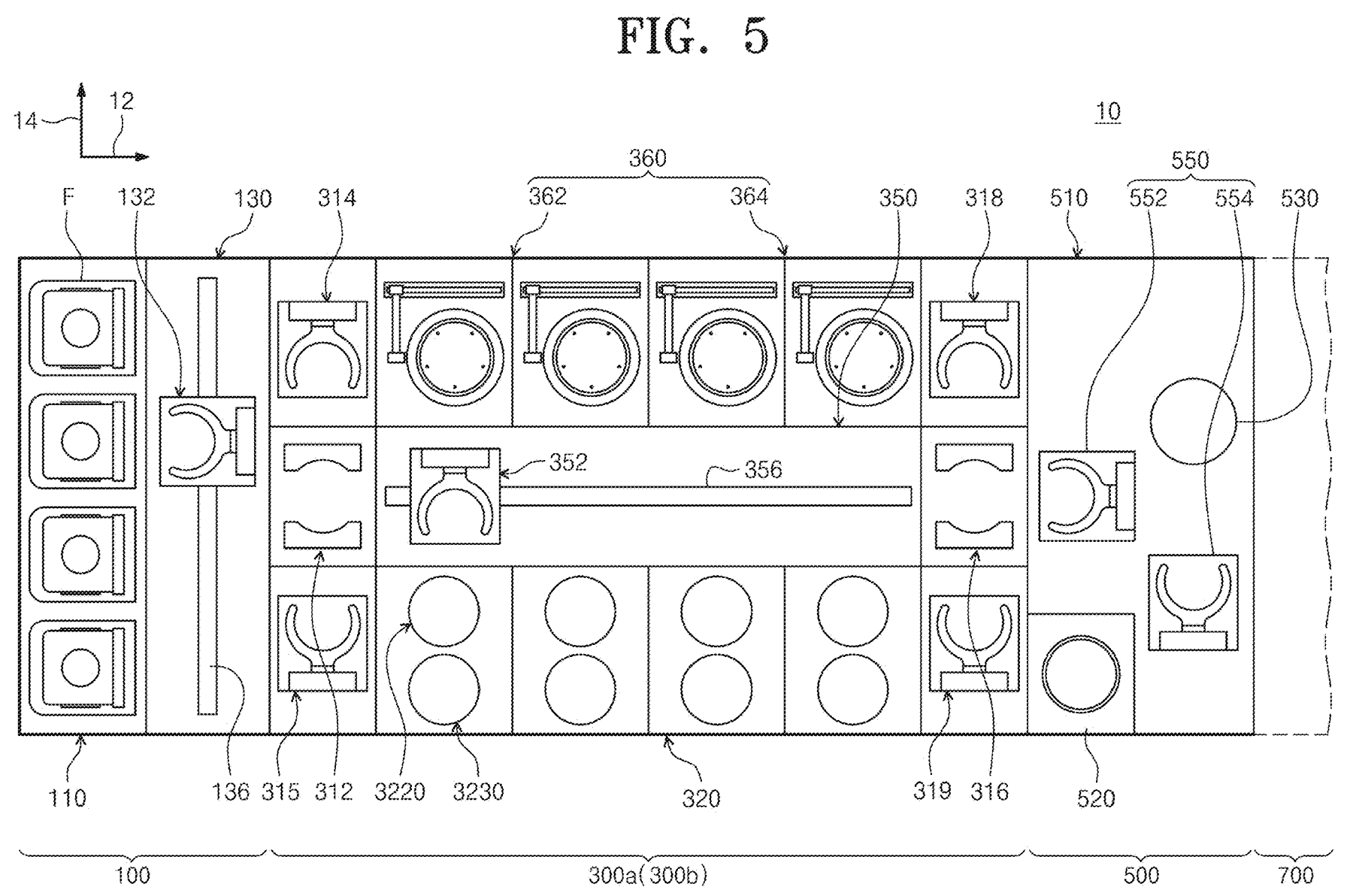

FIG. 3 is a perspective view schematically illustrating a substrate treating apparatus according to an exemplary embodiment of the present invention, FIG. 4 is a cross-sectional view of a coating block or a developing block of the substrate treating apparatus of FIG. 3, and FIG. 5 is a top plan view of the substrate treating apparatus of FIG. 3.

Referring to FIGS. 3 to 5, a substrate treating apparatus 10 according to the exemplary embodiment of the present invention includes an index module 100, a treating module 300, an interface module 500, and a controller 600. According to the exemplary embodiment, the index module 100, the processing module 300, and the interface module 500 are sequentially arranged in a line. Hereinafter, the direction in which the index module 100, the processing module 300, and the interface module 500 are arranged is called a first direction 12, and when viewed from the top, a direction perpendicular to the first direction 12 is defined as a second direction 14, and a direction perpendicular to both the first direction 12 and the second direction 14 is defined as a third direction 16.

The controller may control the substrate treating apparatus 10. For example, the controller may control the index module 100, the processing module 300, and the interface module 500 included in the substrate treating apparatus 10.

The controller may include a process controller formed of a microprocessor (computer) that executes the control of the substrate treating apparatus 10, a user interface formed of a keyboard in which an operator performs a command input operation or the like in order to manage the substrate treating apparatus 10, a display for visualizing and displaying an operation situation of the substrate treating apparatus 10, and the like, and a storage unit storing a control program for executing the process executed in the substrate treating apparatus 10 under the control of the process controller or a program, that is, a treatment recipe, for executing the process in each component according to various data and treatment conditions.

Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

The index module 100 transfers a substrate W to the processing module 300 from a container F in which the substrate W is accommodated, and receives the completely treated substrate W into the container F. A longitudinal direction of the index module 100 is provided in the second direction 14. The index module 100 includes a load port 110 and an index frame 130. With respect to the index frame 130, the load port 110 is located on the opposite side of the processing module 300. The container F in which the substrates W are accommodated is placed on the load port 110. A plurality of load ports 110 may be provided, and the plurality of load ports 110 may be disposed along the second direction 14.

As the container F, an airtight container F, such as a Front Open Unified Pod (FOUP), may be used. The container F may be placed on the load port 110 by a transfer means (not illustrated), such as an overhead transfer, an overhead conveyor, or an automatic guided vehicle, or an operator.

An index robot 132 is provided inside the index frame 130. A guide rail 136 of which a longitudinal direction is provided in the second direction 14 is provided within the index frame 130, and the index robot 132 may be provided to be movable on the guide rail 136. The index robot 132 includes a hand on which the substrate W is placed, and the hand is provided to be movable forward and backward, rotatable about the third direction 16, and movable in the third direction 16.

The processing module 300 may perform a coating process and a developing process on the substrate W. The processing module 300 may receive the substrate W accommodated in the container F and perform a substrate treating process. The processing module 300 includes a coating block 300*a* and a developing block 300*b*. The coting block 300*a* performs a coating process on the substrate W, and the developing block 300*b* performs a developing process on the substrate W. A plurality of coating blocks 300*a* is provided, and the coating blocks 300*a* are provided to be stacked on each other. A plurality of developing blocks 300*b* is provided, and the developing blocks 300*b* is provided to be stacked on each other. According to the exemplary embodiment of FIG. 3, two coating blocks 300*a* are provided, and two developing blocks 30*b* are provided. The coating blocks 300*a* may be disposed under the developing blocks 300*b*. According to an example, the two coating blocks 300*a* perform the same process, and may be provided in the same structure. Further, the two developing blocks 300*b* may perform the same process and may be provided in the same structure.

Referring to FIG. 5, each of the coating block 300*a* and the developing block 300*b* has a heat treating chamber 320, a transfer chamber 350, a liquid processing chamber 360, and buffer chambers 312 and 316.

The heat treating chamber 320 performs a heating process on the substrate W. A plurality of heat treating chambers 320 is provided. The heat treating chambers 320 are arranged in the first direction 12. The heat treating chambers 320 are located at one side of the transfer chamber 350.

The liquid processing chamber 360 may supply a coating liquid, such as a photoresist, onto the substrate W to form a coating film or supply a developer for extracting a pattern from the liquid film on which an exposure process has been performed. The coating film may be a photoresist layer or an Anti-Reflective Coating layer (ARC).

The transfer chamber 350 transfers the substrate W between the heat treating chamber 320 and the liquid treating chamber 360 in the coating block 300*a* or the developing block 300*b*. The transfer chamber 350 is provided so that a longitudinal direction thereof is parallel to the first direction 12. The transfer robot 350 is provided to the transfer chamber 352. The transfer robot 352 transfers the substrate between the heat treating chamber 320, the liquid treating chamber 360, and the buffer chambers 312 and 316. According to an example, the transfer robot 352 includes a hand on which the substrate W is placed, and the hand may be provided to be movable forward and backward, rotatable about the third direction 16, and movable in the third direction 16. A guide rail 356, of which a longitudinal direction is parallel to the first direction 12, is provided within the transfer chamber 350, and the transfer robot 900 may be provided to be movable on the guide rail 356.

A plurality of buffer chambers 312 and 316 is provided. Some of the buffer chambers 312 and 316 are disposed between the index module 100 and the transfer chamber 350. Hereinafter, the foregoing buffer chambers are referred to as front buffers 312. A plurality of front buffers 312 are provided, and are positioned to be stacked on each other in the vertical direction. Another part of the buffer chambers 312 and 316 is disposed between the transfer chamber 350 and the interface module 500. Hereinafter, the foregoing buffer chambers are referred to as rear buffers 316. A plurality of rear buffers 316 are provided, and are positioned to be stacked on each other in the vertical direction. Each of the front buffers 312 and the rear buffers 316 temporarily stores a plurality of substrates W. The substrate W stored in the front buffer 312 is loaded or unloaded by the index robot 132 and the transfer robot 352. The substrate W stored in the rear buffer 316 is loaded or unloaded by the transfer robot 352 and the first robot 552.

In addition, a first front buffer robot 314 and a second front buffer robot 315 for transferring the substrate W between the front buffers 312 may be provided on one side and the other side of the front buffer 312. The first front buffer robot 314 and the second front buffer robot 315 may be positioned symmetrically to each other with the front buffer 312 interposed therebetween when viewed from the top. In addition, the first front buffer robot 314 and the second front buffer robot 315 may each have a transfer hand. In addition, the first front buffer robot 314 and the second front buffer robot 315 may be provided at different heights from each other.

In addition, a first rear buffer robot 318 and a second rear buffer robot 319 for transferring the substrate W between the rear buffers 316 may be provided on one side and the other side of the rear buffer 316. The first rear buffer robot 318 and the second rear buffer robot 319 may be positioned symmetrically to each other with the rear buffer 316 interposed therebetween when viewed from the top. In addition, the first rear buffer robot 318 and the second rear buffer robot 319 may each have a transfer hand. In addition, the first rear buffer robot 318 and the second rear buffer robot 319 may be provided at different heights from each other.

The interface module 500 connects the processing module 300 to an external exposing device 700. The interface module 500 includes an interface frame 510, an additional process chamber 520, an interface buffer 530, and an interface robot 550.

A fan filter unit for forming a descending airflow therein may be provided at an upper end of the interface frame 510. The additional process chamber 520, the interface buffer 530, and the interface robot 550 are disposed inside the interface frame 510. In the additional process chamber 520, the substrate W that has been completely processed in the coating block 300a may be transferred to the exposing device 700. In the exposing device 700, an exposure process of irradiating light by using a mask may be performed on the substrate W on which the coating film is formed. In addition, a predetermined additional process may be performed before the substrate W is loaded into the exposing device 700. Optionally, the additional process chamber 520 may perform a predetermined additional process before the substrate W, which has been completely processed in the exposing device 700, is loaded into the developing block 300b. According to one example, the additional process may be an edge exposure process of exposing an edge region of the substrate W, a top surface cleaning process of cleaning the upper surface of the substrate W, or a lower surface cleaning process of cleaning the lower surface of the substrate W. A plurality of additional process chambers 520 is provided, and may be provided to be stacked on each other. All of the additional process chambers 520 may be provided to perform the same process. Optionally, a part of the additional process chambers 520 may be provided to perform different processes.

The interface buffer 530 provides a space in which the substrate W transferred between the coating block 300a, the additional process chamber 520, the exposing device 700, and the developing block 300b temporarily stays during the transfer. A plurality of interface buffers 530 may be provided, and the plurality of interface buffers 530 may be provided to be stacked on each other.

According to the example, the additional process chamber 520 may be disposed on one side of the transfer chamber 350 based on an extended line in the longitudinal direction and the interface buffer 530 may be disposed on the other side thereof.

The interface robot 550 transfers the substrate W between the coating block 300a, the additional process chamber 520, the exposing device 700, and the developing block 300b. The interface robot 550 may have a transfer hand that transfers the substrate W. The interface robot 550 may be provided as one or a plurality of robots. According to the example, the interface robot 550 has a first robot 552 and a second robot 554. The first robot 552 may be provided to transfer the substrate W between the coating block 300a, the additional process chamber 520, and the interface buffer 530, and the second robot 554 may be provided to transfer the substrate W between the interface buffer 530 and the exposing device 700, and the second robot 554 may be provided to transfer the substrate W between the interface buffer 530 and the developing block 300b.

The first robot 552 and the second robot 554 each include a transfer hand on which the substrate W is placed, and the hand may be provided to be movable forward and backward, rotatable about an axis parallel to the third direction 16, and movable along the third direction 16.

Figure 6:
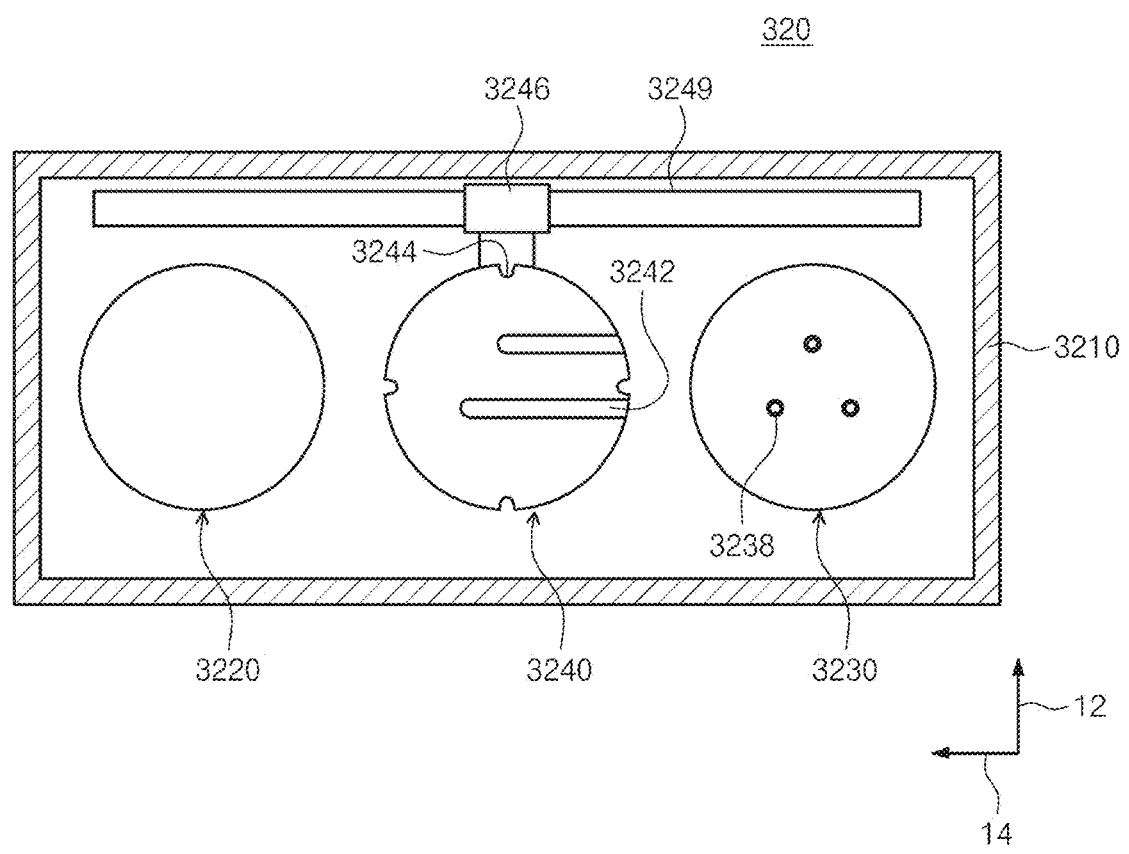
FIG. 6 is a top plan view schematically illustrating an example of a heat treating chamber of FIG. 5.
Figure 7:
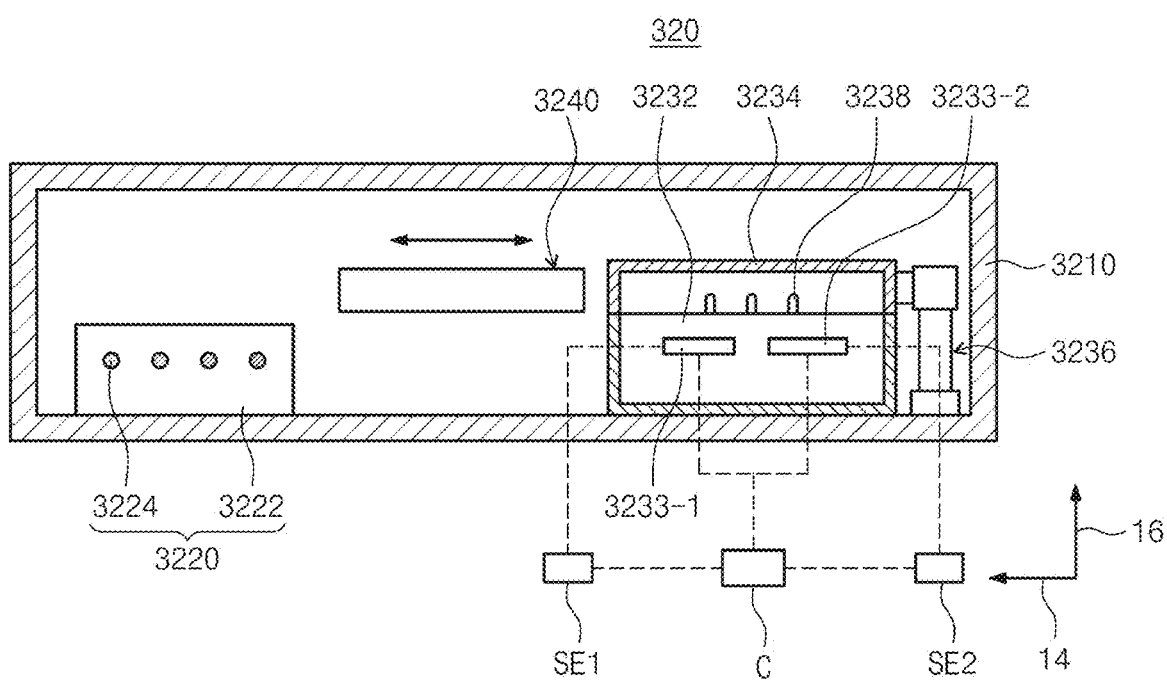
FIG. 7 is a front view of the heat treating chamber of FIG. 6.
Figure 8:
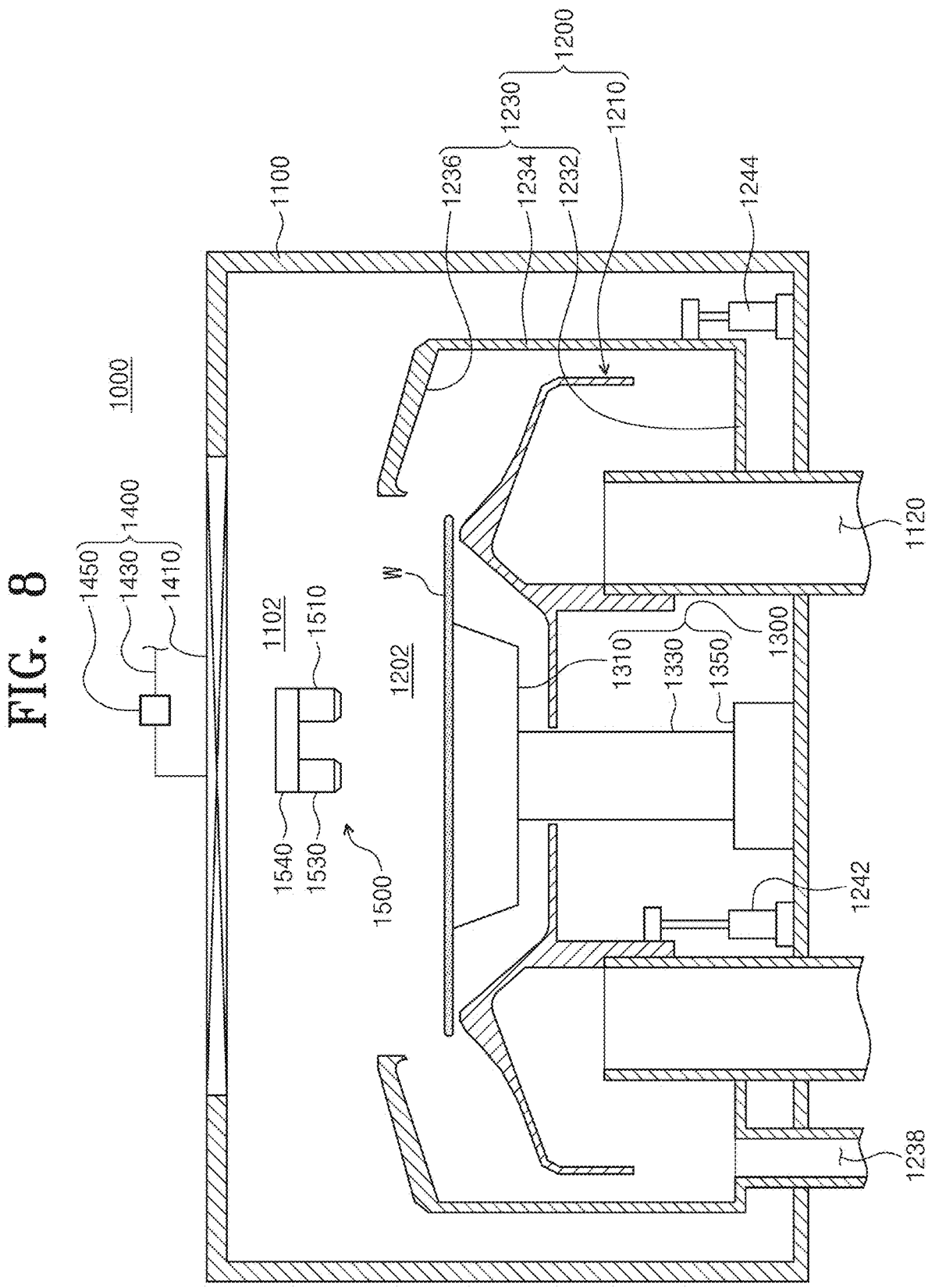
FIG. 8 is a diagram schematically illustrating an example of the substrate treating apparatus provided in a liquid processing chamber of FIG. 7.
Figure 9:
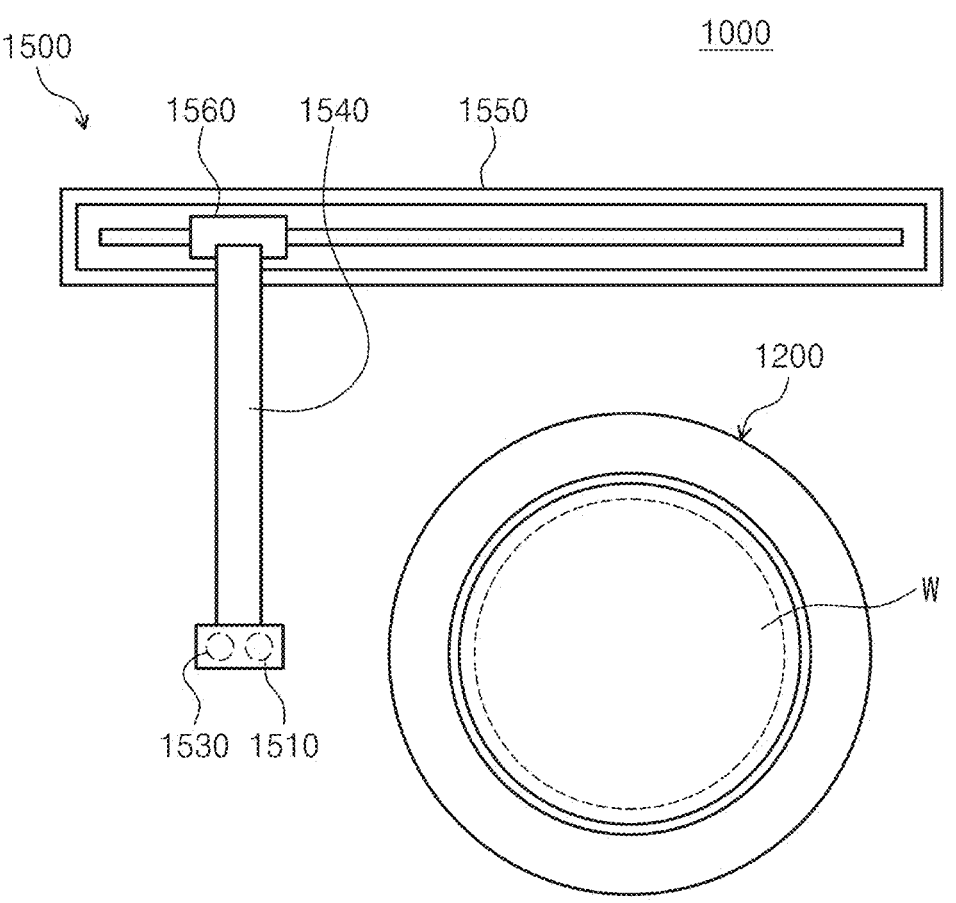
FIG. 9 is a top plan view of the substrate treating apparatus provided in the liquid processing chamber of FIG. 8.

FIG. 6 is a top plan view schematically illustrating an example of the heat treating chamber of FIG. 5, and FIG. 7 is a front view of the heat treating chamber of FIG. 6.

Referring to FIGS. 6 and 7, the heat treating chamber 320 includes a housing 3210, a cooling unit 3220, a heating unit 3230, and a transfer plate 3240.

The housing 3210 is provided in the shape of a generally rectangular parallelepiped. An entrance (not illustrated) through which the substrate W enters and exits is formed on the sidewall of the housing 3210. The entrance may remain open. Optionally, a door (not illustrated) may be provided to open and close the entrance. The cooling unit 3220, the heating unit 3230, and the conveying plate 3240 are provided in the housing 3210. The cooling unit 3220 and the heating unit 3230 are provided side by side along the second direction 14. According to an example, the cooling unit 3220 may be located closer to the transfer chamber 350 than the heating unit 3230.

The cooling unit 3220 includes a cooling plate 3222. The cooling plate 3222 may have a generally circular shape when viewed from the top. The cooling plate 3222 is provided with a cooling member 3224. According to an example, the cooling member 3224 is formed inside the cooling plate 3222 and may be provided as a flow path through which the cooling fluid flows.

The heating unit 3230 may include a heating plate 3232, a cover 3234, a heater 3233, a control unit C, and a sensor SE.

The heating plate 3232 has a generally circular shape when viewed from the top. The heating plate 3232 has a larger diameter than that of the substrate W. A heater 3233 is installed in the heating plate 3232. The heater 3233 may be provided as a heating resistor to which current is applied. The heating plate 3232 is provided with lift pins 3238 drivable in the vertical direction along the third direction 16. The lift pin 3238 receives the substrate W from the transfer means outside the heating unit 3230 and places the received substrate W on the heating plate 3232 or lifts the substrate W from the heating plate 3232 and takes over the substrate W to a transfer means outside the heating unit 3230. According to an example, three lift pins 3238 may be provided. The cover 3234 has a space with an open lower portion therein. The cover 3234 is positioned above the heating plate 3232 and is moved up and down by the driver 3236. A space formed by the cover 3234 and the heating plate 3232 according to the movement of the cover 3234 is provided as a heating space for heating the substrate W.

The heater 3233 may increase a temperature of the heating plate 3232. The heater 3233 may include a first heater 3233-1 and a second heater 3233-2. The first heater 3233-1 and the second heater 3233-2 may be installed at different positions. The first heater 3233-1 may heat a first area of the heating plate 3232. The second heater 3233-2 may heat a second area of the heating plate 3232.

The sensor SE may measure the temperature of the heater 3233 or the temperature of the heating plate 3232 heated by the heater 3233. The sensor SE is a first sensor SE1 for measuring the temperature of the first heater 3233-1 or the temperature of the first area of the heating plate 3232, and a second book SE2 for measuring the temperature of the second heater 3233-2 or the temperature of the second area of the heating plate 3232. A temperature measured by the first sensor SE1 may be referred to as a first temperature, and a temperature measured by the second sensor SE2 may be referred to as a second temperature.

The temperature measured by the sensor SE may be transmitted to the control unit C. The controller C may control the temperature of the heater 3233 based on the temperature measured by the sensor SE. A control circuit of the heater 3233 including the control unit C will be described later.

The transfer plate 3240 is provided in a substantially disk shape, and has a diameter corresponding to that of the substrate W. A notch 3240 is formed at the edge of the transfer plate 3244. The notch 3244 may have a shape corresponding to a protrusion 3543 formed on the hand 354 of the transfer robot 352. In addition, the notches 3244 are provided in a number corresponding to the number of protrusions 3543 formed on the hand 354, and are formed at positions corresponding to the protrusions 3543. When the upper and lower positions of the hand 354 and the transfer plate 3240 are changed in a position where the hand 354 and the transfer plate 3240 are vertically aligned, the substrate W is transferred between the hand 354 and the transfer plate 3240. The transfer plate 3240 is mounted on a guide rail 3249, and may be moved between a first region 3212 and a second region 3214 along the guide rail 3249 by a driver 3246. A plurality of slit-shaped guide grooves 3242 is provided in the transfer plate 3240. The guide groove 3242 extends from the end of the transfer plate 3240 to the inside of the transfer plate 3240. The length direction of the guide grooves 3242 is provided along the second direction 14, and the guide grooves 3242 are spaced apart from each other along the first direction 12. The guide groove 3242 prevents the transfer plate 3240 and the lift pins 3238 from interfering with each other when the substrate W is transferred between the transfer plate 3240 and the heating unit 3230.

The substrate W is cooled in the state where the transfer plate 3240 on which the substrate W is placed is in contact with the cooling plate 3222. The transfer plate 3240 is made of a material having high thermal conductivity so that heat transfer between the cooling plate 3222 and the substrate W is well achieved. According to an example, the transfer plate 3240 may be provided with a metal material.

The heating units 3230 provided in some of the heat treating chambers 320 may supply a gas while heating the substrate W to improve the adhesion rate of the photoresist to the substrate W. According to the example, the gas may be hexamethyldisilane (HMDS) gas.

A plurality of liquid processing chambers 360 is provided. Some of the liquid processing chambers 360 may be provided to be stacked on each other. The liquid processing chambers 360 are disposed at one side of the transfer chamber 350. The liquid processing chambers 360 are arranged side by side along the first direction 12. Some of the liquid processing chambers 360 are provided at positions adjacent to the index module 100. Hereinafter, the liquid treating chambers 360 are referred to as front liquid treating chambers 362. Another some of the liquid processing chambers 360 are provided at positions adjacent to the interface module 500. Hereinafter, the liquid treating chambers 360 are referred to as rear liquid treating chambers 364. The coating liquid may be supplied from the liquid processing chamber 360 provided in the coating block 300a, and the developer may be supplied from the liquid processing chamber 360 provided in the developing block 300b.

FIG. 6 is a diagram schematically illustrating an example of a substrate treating apparatus provided in the liquid processing chamber of FIG. 7, and FIG. 7 is a top plan view of the substrate treating apparatus provided in the liquid processing chamber of FIG. 6. FIGS. 6 and 7 illustrate the liquid processing chamber 360 provided in the coating block 300a. In addition, since the liquid processing chamber 360 provided in the developing block 300b has the same/similar configuration as the liquid processing chamber 360 provided in the coating block 300a except that the type of processing liquid used is different, a repeated description of the liquid processing chamber 360 provided in the developing block 300b will be omitted.

Referring to FIGS. 6 and 7, a substrate treating apparatus 1000 for processing a substrate W may be provided in the liquid processing chamber 360. The substrate treating apparatus 1000 performing the liquid treatment on the substrate W may be provided in the liquid treating chamber 360.

The substrate treating apparatus 1000 provided in the liquid processing chamber 360 may include a housing 1100, a processing container 1200, a support unit 1300, an airflow supply unit 1400, and a liquid discharge unit 1500.

The housing 1100 may have an inner space 1102. The housing 1100 may be provided in a quadrangular cylindrical shape having the inner space 1102. An opening (not illustrated) may be formed at one side of the housing 1100. The opening may serve as an inlet through which the substrate W is loaded into the inner space 1102 or the substrate W is unloaded from the inner space 1102. In addition, in order to selectively close the opening, a door (not illustrated) may be installed in an area adjacent to the opening. The door may seal the internal space 1102 by blocking the opening while the treatment process for the substrate W loaded into the internal space 1102 is performed.

The treatment container 1200 may be disposed in the internal space 1102. The treatment container 1200 may have a treatment space 1202. That is, the treatment container 1200 may be a bowl having the treatment space 1202. Accordingly, the inner space 1102 may be provided to surround the treatment space 1202. The treatment container 1200 may have a cup shape with an open top. The treatment space 1202 of the treatment container 1200 may be a space in which a support unit 1300, which is to be described below, supports and rotates the substrate W. The processing space 1202 may be a space in which each of the liquid discharge unit 1500 and the wetting unit 1600 supplies a processing medium and the substrate W is treated.

The treatment container 1200 may include an inner cup 1210 and an outer cup 1230. The outer cup 1230 is provided to surround the circumference of the support unit 1300, and the inner cup 1210 may be located inside the outer cup 1230. Each of the inner cup 1210 and the outer cup 1230 may have an annular ring shape when viewed from the top. A space between the inner cup 1210 and the outer cup 1230 may function as a recovery path through which the treatment medium introduced into the treatment space 1202 is recovered.

The inner cup 1230 may be provided in a shape surrounding a rotation shaft 1330 of the support unit 1300, which is to be described below, when viewed from the top. For example, the inner cup 1230 may be provided in a circular plate shape surrounding the rotation shaft 1330 when viewed from above. When viewed from the top, the inner cup 1230 may be positioned to overlap an exhaust port 1120 coupled to the housing 1100. The inner cup 1230 may have an inner portion and an outer portion. An upper surface of each of the inner portion and the outer portion may be provided to have different angles from each other based on an virtual horizontal line. For example, when viewed from the top, the inner portion may be positioned to overlap the support plate 1310 of the support unit 1300, which is to be described below. The inner portion may be positioned to face the rotation shaft 1330. The inner portion may have an upper surface inclined upward as it goes away from the rotation shaft 1330, and the outer portion may extend outwardly from the inner portion. The outer portion may have an upper surface inclined downward as it goes away from the rotation shaft 1330. The upper end of the inner portion may coincide with the side end portion of the substrate W in the vertical direction.

According to the example, the point where the outer portion and the inner portion meet may be a position lower than the upper end of the inner portion. The point where the inner portion the outer portion meet each other may be provided to be rounded. The outer portion may be combined with the outer cup 1230 to form a recovery path through which a treatment medium, such as a processing liquid and a wet medium, is recovered.

The outer cup 1230 may be provided in a cup shape surrounding the support unit 1300 and the inner cup 1210. The outer cup 1230 may have a bottom portion 1232, a side portion 1234, and an inclined portion 1236. The bottom portion 1232 may have a circular plate shape having a hollow. A recovery line 1238 may be connected to the bottom portion 1232. The recovery line 1238 may recover the treatment medium supplied on the substrate W. The treatment medium recovered by the recovery line 1238 may be reused by an external recycling system. The side portion 1234 may have an annular ring shape surrounding the support unit 1300. The side portion 1234 may extend in a vertical direction from the side end of the bottom portion 1232. The side portion 1234 may extend upwardly from bottom portion 1232.

The inclined portion 1236 may extend from an upper end of the side portion 1234 in a direction toward the central axis of the outer cup 1230. An inner surface of the inclined portion 1236 may be provided to be inclined upward to approach the support unit 1300. The inclined portion 1236 may be provided to have a ring shape. During the treatment process for the substrate W, the upper end of the inclined portion 1236 may be positioned higher than the substrate W supported by the support unit 1300.

The inner lifting member 1242 and the outer lifting member 1244 may move the inner cup 1210 and the outer cup 1230 up and down, respectively. The inner lifting member 1242 is coupled to the inner cup 1210, and the outer lifting member 1244 is coupled to the outer cup 1230 to move the inner cup 1210 and the outer cup 1230 up and down, respectively.

The support unit 1300 may support and rotate the substrate W. The support unit 1300 may be a chuck that supports and rotates the substrate W. The support unit 1300 may include the support plate 1310, the rotation shaft 1330, and a rotation driver 1350. The support plate 1310 may have a seating surface on which the substrate W is seated. The support plate 1310 may have a circular shape when viewed from the top. The support plate 1310 may have a smaller diameter than the substrate W when viewed from the top. A suction hole (not illustrated) is formed in the support plate 1310 to chuck the substrate W by a vacuum suction method. Optionally, an electrostatic plate (not illustrated) is provided on the support plate 1310 to chuck the substrate W by an electrostatic adsorption method using static electricity. Optionally, the support plate 1310 may be provided with support pins for supporting the substrate W so that the support pins and the substrate W are physically in contact with each other to chuck the substrate W.

The rotation shaft 1330 may be coupled to the support plate 1310. The rotation shaft 1330 may be coupled to a lower surface of the support plate 1310. The rotation shaft 1330 may be provided such that a longitudinal direction thereof is in the vertical direction. The rotation shaft 1330 may be rotated by receiving power from the rotation driver 1350. Accordingly, the rotation shaft 1330 may rotate the support plate 1310. The rotation driver 1350 may vary the rotation speed of the rotation shaft 1330. The rotation driver 1350 may be a motor that provides driving force. However, the present invention is not limited thereto, and the rotation driver 1350 may be variously modified to a known device that provides driving force.

The airflow supply unit 1400 may supply an airflow to the inner space 1102. The airflow supply unit 1400 may supply a descending airflow to the inner space 1102.

The airflow supply unit 1400 may supply the temperature and/or humidity-controlled airflow to the inner space 1102. The airflow supply unit 1400 may be installed in the housing 1100. The airflow supply unit 1400 may be installed above the processing vessel 1200 and the support unit 1300. The airflow supply unit 1400 may include a fan 1410, an airflow supply line 1430, and a filter 1450. The airflow supply line 1430 may supply an external airflow whose temperature and/or humidity is controlled to the inner space 1102. A filter 1450 is installed in the airflow supply line 1430 to remove impurities contained in the external airflow flowing through the airflow supply line 1430. In addition, when the fan 1410 is driven, the external airflow supplied by the airflow supply line 1430 may be uniformly transmitted to the internal space 1102.

The liquid discharge unit 1500 may discharge the processing liquid to the substrate W supported by the support unit 1300. The processing liquid supplied by the liquid discharge unit 1500 to the substrate W may be a coating liquid. For example, the coating liquid may be a photosensitive liquid, such as a photoresist. Also, the liquid discharge unit 1500 may supply the pre-wet liquid to the substrate W supported by the support unit 1300. The pre-wet liquid supplied by the liquid discharge unit 1500 to the substrate W may be a liquid capable of changing the surface properties of the substrate W. For example, the pre-wet liquid may be a thinner capable of changing the surface property of the substrate W to have a hydrophobic property.

The liquid discharge unit 1500 may include a free wet nozzle 1510, a processing liquid nozzle 1530, an arm 1540, a guide rail 1550, and a driver 1560.

The pre-wet nozzle 1510 may supply the above-described pre-wet liquid to the substrate W. The pre-wet nozzle 1510 may supply the pre-wet liquid to the substrate W in a stream manner. The processing liquid nozzle 1530 may supply the above-described processing liquid to the substrate W. The processing liquid nozzle 1530 may be a coating liquid nozzle that supplies a coating liquid, such as the above-described photoresist. The processing liquid nozzle 1530 may supply the processing liquid to the substrate W in a stream manner. Both the pre-wet liquid and the coating liquid may be referred to as a processing liquid.

The arm 1540 may support the free wet nozzle 1510 and the processing liquid nozzle 1530. The free wet nozzle 1510 and the processing liquid nozzle 1530 may be installed at one end of the arm 1540. Each of the free wet nozzle 1510 and the processing liquid nozzle 1530 may be installed on the lower surface of one end of the arm 1540. When viewed from the top, the free wet nozzle 1510 and the processing liquid nozzle 1530 may be arranged in a direction parallel to the longitudinal direction of the guide rail 1550 which is to be described below. The other end of the arm 1540 may be coupled to the driver 1560. The arm 1540 may be moved by driver 1560 which moves arm 1540. Accordingly, the positions of the free wet nozzle 1510 and the processing liquid nozzle 1530 installed on the arm 1540 may be changed. The movement direction of the arm 1540 may be guided along the guide rail 1550 on which the driver 1560 is installed. The guide rail 1550 may be provided such that a longitudinal direction thereof faces a horizontal direction. For example, the guide rail 1550 may be provided such that its longitudinal direction faces a direction parallel to the first direction 12. Optionally, the arm 1540 may be rotated by being coupled to the rotation shaft whose longitudinal direction faces the third direction 16. The rotational shaft may be rotated by the driver. Accordingly, the positions of the free wet nozzle 1510 and the processing liquid nozzle 1530 installed on the arm 1540 may be changed.

Hereinafter, a control circuit for controlling the temperature of the heater 3233, a control method of the heating unit 3230, and more specifically, a method of controlling a temperature of the heater 3233 included in the heating unit 3230 will be described in detail.

Figure 10:
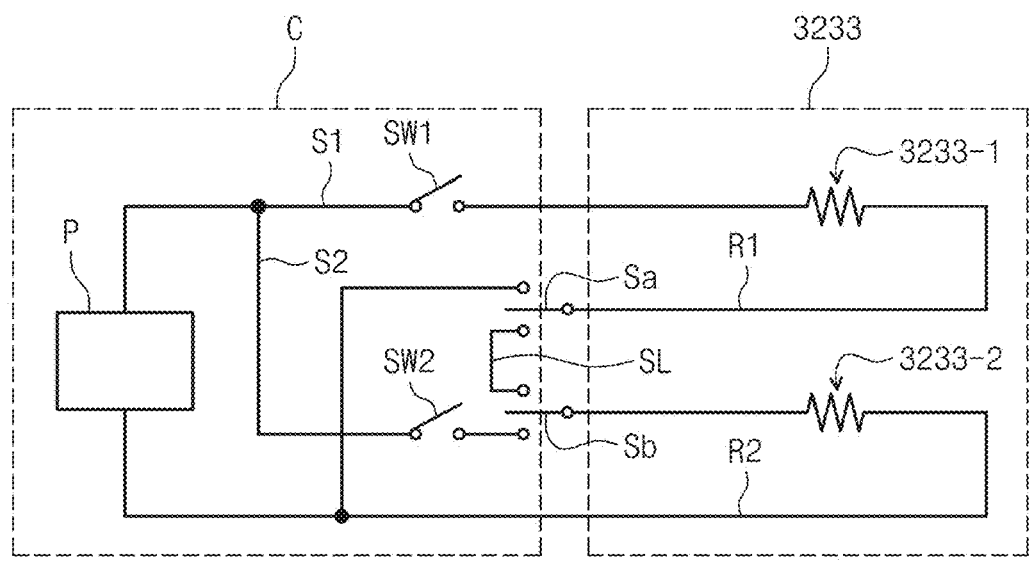
FIG. 10 is a diagram illustrating a control circuit for controlling a temperature of a heater unit of FIG. 7.

FIG. 10 is a diagram illustrating the control circuit for controlling a temperature of the heater unit of FIG. 7.

Referring to FIG. 10, the temperature of the heater 3233 may be controlled by the controller C. The control unit C may include a power source P, a first power switch SW1, a second power switch SW, and a switching module SM. Also, the power source P of the control unit C may be transmitted to the heater 3233 through a power line PL.

The power source P may generate power to heat the heater 3233. The heater 3233 may be a resistance heating element. The heater 3233 may be a hot wire. The heater 3233 may include a first heater 3233-1 and a second heater 3233-2 as described above. The power source P may transmit power to at least one of the first heater 3233-1 and the second heater 3233-2 to heat the first heater 3233-1 and/or the second heater 3233-2.

The power line PL may transmit the power generated by the power source P to the heater 3233. The power line PL may include a first supply line S1, a first return line R1, a second supply line S2, and a second return line R2.

The first supply line S1 may be connected to a front end of the first heater 3233-1 based on the direction in which the current flows. The first return line R1 may be connected to a rear end of the first heater 3233-1 based on the direction in which the current flows.

The second supply line S2 may be connected to a front end of the second heater 3233-2 based on the direction in which the current flows. The second return line R2 may be connected to a rear end of the second heater 3233-2 based on the direction in which the current flows.

The first power switch SW1 may be installed on the first supply line S1. The second power switch SW2 may be installed on the second supply line S2. As will be described later, when the first heater 3233-1 and the second heater 3233-2 are connected in parallel by the switching module SM, whether the first heater 3233-1 may be driven is determined by on/off of the first power switch SW1, and whether the second heater 3233-2 is driven may be determined by on/off of the second power switch SW1.

The switching module SM may include a switching line SL, a first switching switch Sa, and a second switching switch Sb. The switching line SL may be provided between the first return line R1 and the second supply line S2.

The first switching switch Sa is installed on the first return line R1, and may be connected with the switching line SL according to the switching. When the first switching switch Sa is switched to the switching line SL, the first return line R1 may be opened. When the first switching switch Sa is switched to the first return line R1, the first return line R1 may constitute a closed circuit including the power source P and the first heater 3233-1.

The second switching switch Sb is installed on the second supply line S2, and may be connected to the switching line SL according to the switching. When the second switching switch Sb is switched to the switching line SL, the second supply line S2 may be opened. When the second switching switch Sb is switched to the second supply line S1, the second supply line S1 may constitute a closed circuit including the power source P and the second heater 3233-2.

Figure 11:
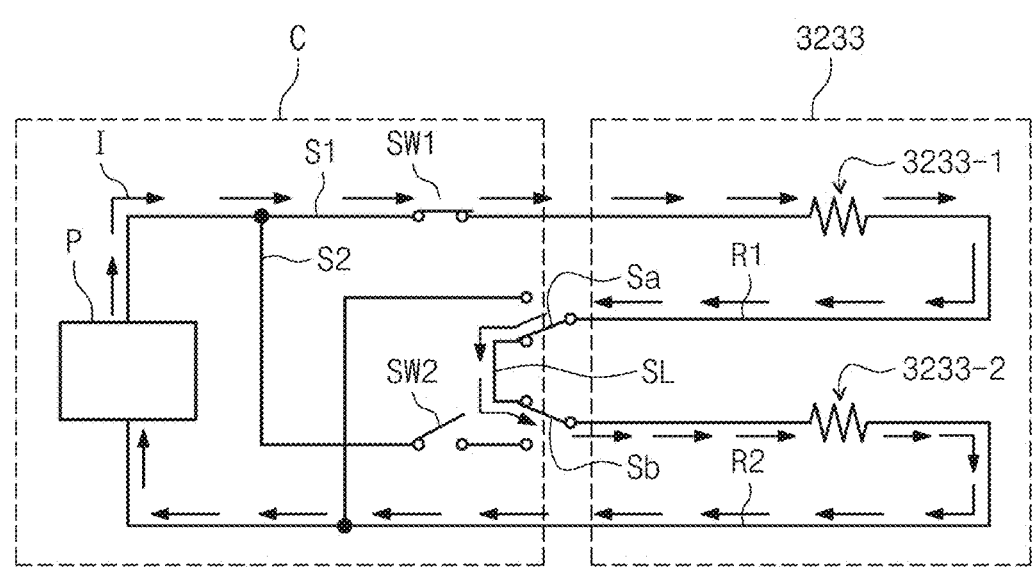
FIG. 11 is a diagram illustrating a state of the control circuit for controlling the temperature of the heater unit in a first mode.

FIG. 11 is a diagram illustrating a state of the control circuit for controlling the temperature of the heater unit in a first mode. As illustrated in FIG. 11, when the first switching switch Sa and the second switching switch Sb are switched to the switching line SL, the first heater 3233-1 and the second heater 3233-2 may be connected in series. When the first heater 3233-1 and the second heater 3233-2 are connected in series, the same current I flows. This control mode is referred to as a first mode (serial control mode). When the first heater 3233-1 and the second heater 3233-2 are connected in series, whether to transmit power to the first heater 3233-1 and the second heater 3233-2 is determined by the switching of the first power switch SW1.

Figure 12:
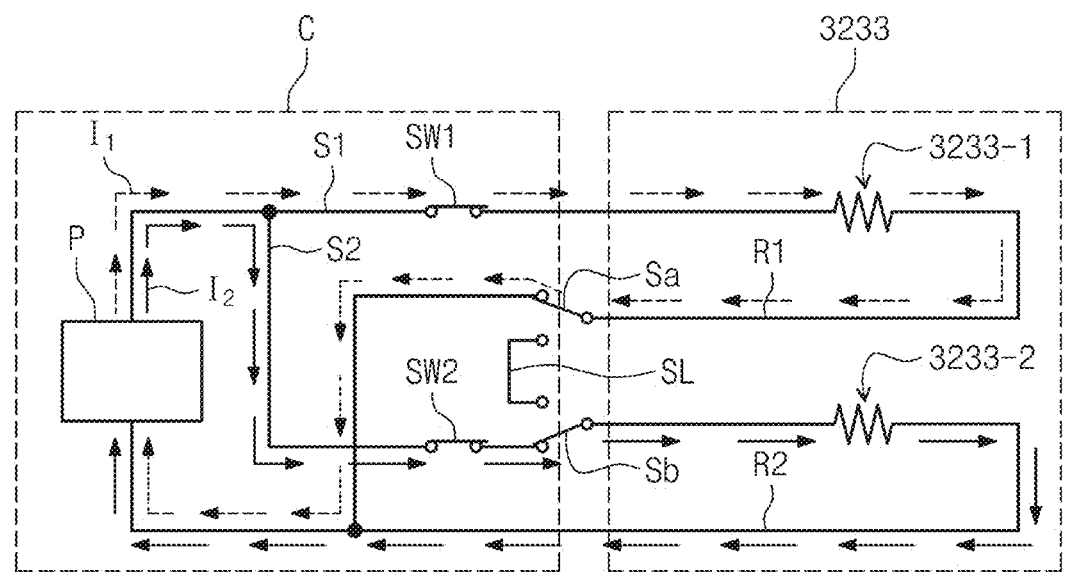
FIG. 12 is a diagram illustrating the control circuit for controlling the temperature of the heater unit in a second mode.

FIG. 12 is a diagram illustrating the control circuit for controlling the temperature of the heater unit in a second mode. As illustrated in FIG. 12, when the first switching switch Sa is switched to the first return line R1 and the second switching switch Sb is switched to the second supply line R2, the first heater 3233-1 and the second heater 3233-2 may be connected in parallel. When the first heater 3233-1 and the second heater 3233-2 are connected in parallel, a first current I1 may flow in the first heater 3233-1 and a second current I1 may flow in the second heater 3233-2. This control mode is called a second mode (parallel control mode). When the first heater 3233-1 and the second heater 3233-2 are connected in parallel, whether to transmit power to the first heater 3233-1 is determined by the switching of the first power switch SW1, and independently of this, whether to transmit power to the second heater 3233-2 may be determined by switching of the second power switch SW2.

According to the exemplary embodiment of the present invention, after raising the temperatures of the heaters 3233 in the first mode, the temperature of the heaters 3233 may be controlled in the second mode.

Specifically, in the first mode, the first heater 3233-1 and the second heater 3233-2 are connected in series. The magnitude of the voltage of the power source P is constant. Accordingly, the size of the current I is determined by the sum of the resistance of the first heater 3233-1 and the resistance of the second heater 3233-2. When the first heater 3233-1 and the second heater 3233-2 are connected in series, the total resistance of the closed circuit increases. Accordingly, the size of the current I is smaller than each of the sizes of the first current I1 and the second current I2 in the second mode. In other words, it is possible to drop the peak current at the initial stage of temperature increase. Thereafter, the temperature of the heater 3233 may be precisely controlled in the second mode.

In other words, it is possible to improve the facility load factor and facility system capacity by dropping the peak current of the initial stage of the temperature increase of the heater 3233. Also, energy consumption efficiency may be improved. In addition, when the temperature of the heater 3233 rises above a certain temperature (that is, when the temperature of the heater 3233 is close to a target temperature), it is possible to precisely control the temperature of each region of the heating plate 3230 by controlling the temperature of each of the first heater 3233-1 and the second heater 3233-2 in the second mode.

Hereinafter, a method of controlling the temperature of the heater 3233 will be described in more detail.

Figure 13:
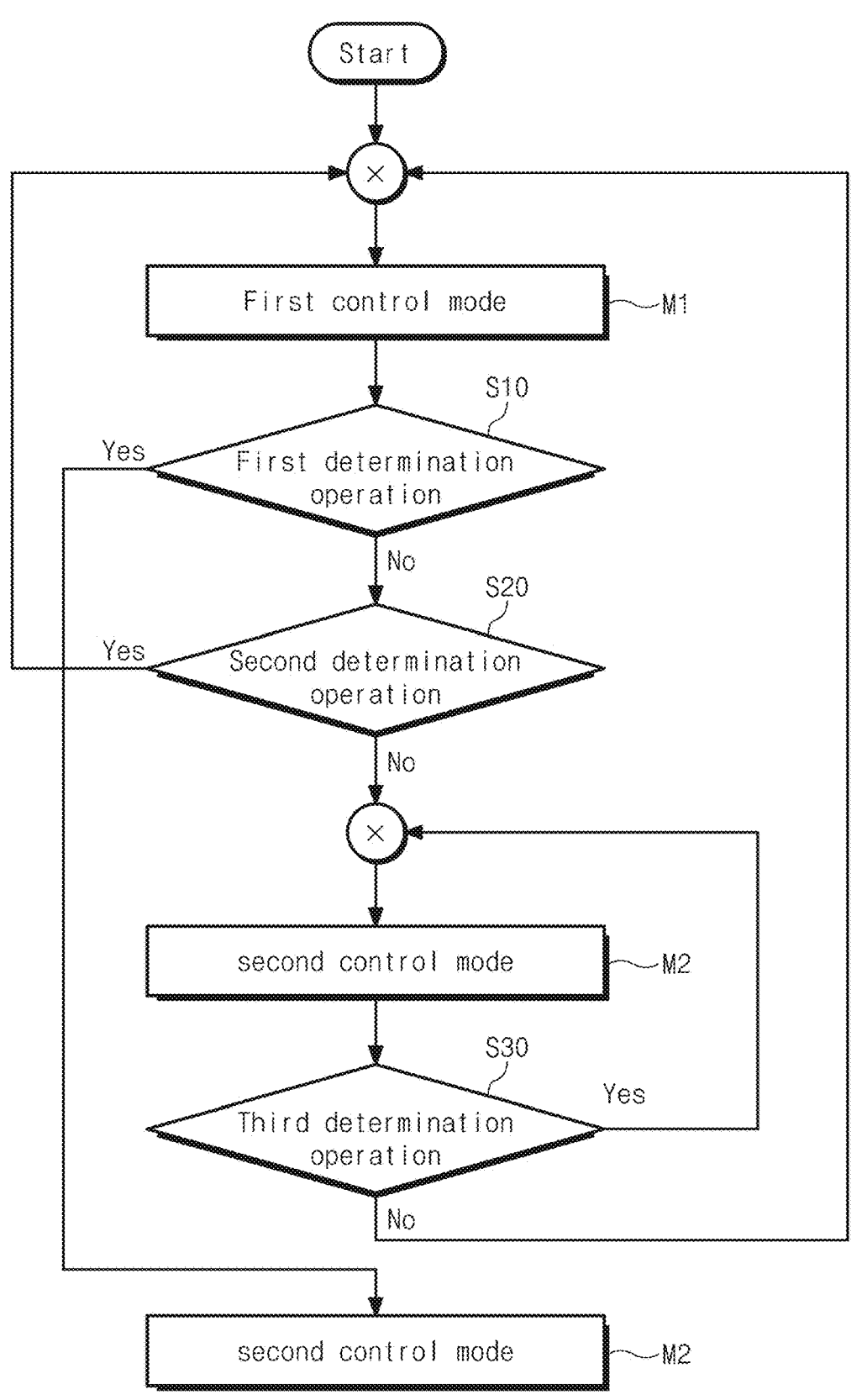
FIG. 13 is a flowchart illustrating an algorithm for increasing the temperature of the heater unit.

FIG. 13 is a flowchart illustrating an algorithm for increasing the temperature of the heater. The temperature increasing algorithm of the heater 3233 to be described below may be performed by controlling, by the control unit C, at least one of the first power switch SW1, the second power switch SW2, the first switching switch Sa, and the second switching switch Sb.

Referring to FIG. 13, the temperature of the heater 3233 may be controlled in a mode selected from among the first mode M1 and the second mode M2.

When the temperature control of the heater 3233 is started, the temperature of the heater 3233 may be increased in the first mode M1 in which the first heater 3233-1 and the second heater 3233-2 are connected in series. In addition, when a preset condition is satisfied, the mode may be switched from the first mode M1 to the second mode M2. For example, whether to switch the mode from the first mode M1 to the second mode M2 may be determined based on the first temperature measured by the first sensor SE1 and/or the second temperature measured by the second sensor SE2.

In a first determination operation S10, it is determined whether the first temperature or the second temperature is equal to or higher than a preset switching temperature.

When the first temperature or the second temperature is equal to or higher than the preset switching temperature (Yes) in the first determination operation S10, the mode is switched from the first mode M1 to the second mode M2.

When the first temperature and the second temperature are lower than the preset switching temperature (No) in the first determination operation S20, a second determination operation S20 is performed.

In the second determination operation S20, a difference value between the first temperature and the second temperature is derived. Then, it is determined whether the difference value between the first temperature and the second temperature is smaller than a preset interlock temperature.

When the difference value is smaller than the interlock temperature (Yes), the first mode M1 is maintained. When the difference value is equal to or greater than the interlock temperature (No), the mode is switched from the first mode M1 to the second mode M2. This is because, when the temperature deviation between the first mode and the second mode is excessively large, precise control is required.

When the mode is switched from the first mode M1 to the second mode M2, a third determination operation S30 is performed thereafter.

In the third determining operation S30, the difference value between the first temperature and the second temperature is again derived. Then, it is determined whether the difference between the first temperature and the second temperature is equal to or greater than a preset restart temperature.

When the re-derived difference value is equal to or greater than the restart temperature (Yes), the second mode M2 is maintained. When the re-derived difference value is smaller than the restart temperature, the temperature of the heater 3233 is increased by switching the mode from the second mode M2 to the first mode M1.

The foregoing detailed description illustrates the present invention. In addition, the above description illustrates and describes the exemplary embodiments of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A heating unit for heating a substrate, the heating unit comprising:

a heating plate configured to heat a substrate;

a heater in the heating plate; and a control unit configured to control the heater, wherein the heater includes a first heater at a first position and configured to heat a first region of the heating plate; and a second heater at a second position and configured to heat a second region of the heating plate, the first region being different from the second region, and the control unit includes:

a power source configured to transfer an electrical current to at least one of the first heater and the second heater; and at least one first temperature sensor configured to sense at least one first temperature of the heater or the heating plate; and a switching module being configured to selectively connect the first heater and the second heater in series or in parallel based on the at least one first temperature, wherein the heating unit further comprising:

a power line configured to transfer the electrical current to at least one of the first heater or the second heater, wherein the power line includes:

a first supply line connected to a front end of the first heater;

a first return line connected to a rear end of the first heater;

a second supply line connected to a front end of the second heater; and a second return line connected to a rear end of the second heater, wherein the switching module includes:

a switching line;

a first switching switch configured to be selectively switched between the switching line and the first return line; and a second switching switch configured to be selectively switched between the switching line and the second supply line, wherein when the first switching switch and the second switching switch are switched to the switching line, the first heater and the second heater are connected in series, and when the first switching switch is switched to the first return line and the second switching switch is switched to the second supply line, the first heater and the second heater are connected in parallel, wherein the control unit includes:

a first power switch on the first supply line; and a second power switch on the second supply line.

2. The heating unit of claim 1, wherein the control unit is configured to control the first switching switch and the second switching switch to control a temperature of the heater in a first mode or a second mode, the first mode having the first heater and the second heater be connected in series, the second mode having the first heater and the second heater be connected in parallel.

3. The heating unit of claim 2, wherein the at least one first temperature sensor includes a first temperature sensor being configured to sense a first temperature of the first heater or the first region; and a second temperature sensor being configured to sense a second temperature of the second heater or a second region.

4. A heating unit for heating a substrate, the heating unit comprising:

a heating plate configured to heat a substrate;

a heater in the heating plate; and a control unit configured to control the heater, wherein the heater includes a first heater at a first position and configured to heat a first region of the heating plate; and a second heater at a second position and configured to heat a second region of the heating plate, the first region being different from the second region, and the control unit includes:

a power source configured to transfer an electrical current to at least one of the first heater and the second heater; and at least one first temperature sensor configured to sense at least one first temperature of the heater or the heating plate; and a switching module being configured to selectively connect the first heater and the second heater in series or in parallel based on the at least one first temperature, wherein the heating unit further comprising:

a power line configured to transfer the electrical current to at least one of the first heater or the second heater, wherein the power line includes:

a first supply line connected to a front end of the first heater;

a first return line connected to a rear end of the first heater;

a second supply line connected to a front end of the second heater; and a second return line connected to a rear end of the second heater, wherein the switching module includes:

a switching line;

a first switching switch configured to be selectively switched between the switching line and the first return line; and a second switching switch configured to be selectively switched between the switching line and the second supply line, wherein the control unit is configured to control the first switching switch and the second switching switch to control a temperature of the heater in a first mode or a second mode, the first mode having the first heater and the second heater be connected in series, the second mode having the first heater and the second heater be connected in parallel, wherein the at least one first temperature sensor includes:

a first temperature sensor being configured to sense a first temperature of the first heater or the first region; and a second temperature sensor being configured to sense a second temperature of the second heater or a second region, wherein the control unit is further configured to control a first switching switch and a second switching switch such that the first mode is switched to the second mode when any one of the first temperature and the second temperature is equal to or higher than a switching temperature.

5. A heating unit for heating a substrate, the heating unit comprising:

a heating plate configured to heat a substrate;

a heater in the heating plate; and a control unit configured to control the heater, wherein the heater includes a first heater at a first position and configured to heat a first region of the heating plate; and a second heater at a second position and configured to heat a second region of the heating plate, the first region being different from the second region, and the control unit includes:

a power source configured to transfer an electrical current to at least one of the first heater and the second heater; and at least one first temperature sensor configured to sense at least one first temperature of the heater or the heating plate; and a switching module being configured to selectively connect the first heater and the second heater in series or in parallel based on the at least one first temperature, wherein the heating unit further comprising:

a power line configured to transfer the electrical current to at least one of the first heater or the second heater, wherein the power line includes:

a first supply line connected to a front end of the first heater;

a first return line connected to a rear end of the first heater;

a second supply line connected to a front end of the second heater; and a second return line connected to a rear end of the second heater, wherein the switching module includes:

a switching line;

a first switching switch configured to be selectively switched between the switching line and the first return line; and a second switching switch configured to be selectively switched between the switching line and the second supply line, wherein the control unit is configured to control the first switching switch and the second switching switch to control a temperature of the heater in a first mode or a second mode, the first mode having the first heater and the second heater be connected in series, the second mode having the first heater and the second heater be connected in parallel, wherein the at least one first temperature sensor includes:

a first temperature sensor being configured to sense a first temperature of the first heater or the first region; and a second temperature sensor being configured to sense a second temperature of the second heater or a second region, wherein the control unit is further configured to determine a first difference value between the first temperature and the second temperature when both the first temperature and the second temperature are lower than a switching temperature, and the control unit is configured to control the first switching switch and the second switching switch such that the first mode is switched to the second mode when the first difference value is equal to or greater than an interlock temperature, and the first mode is maintained when the first difference value is smaller than the interlock temperature.

6. The heating unit of claim 5, wherein the control unit is further configured to determine a second difference value between the first temperature and the second temperature after the first mode is switched to the second mode, and the control unit is configured to control the first switching switch and the second switching switch such that the second mode is maintained when the second difference value is equal to or greater than a restart temperature, and the second mode is switched to the first mode when the second difference value is smaller than the restart temperature.

* * * * *